(12) United States Patent
Dickman et al.

(10) Patent No.: US 7,468,549 B2
(45) Date of Patent: Dec. 23, 2008

(54) METHOD FOR PRODUCING A PACKAGE FOR AN ELECTRONIC CIRCUIT AND A SUBSTRATE FOR A PACKAGE

(75) Inventors: Rory Dickman, Graz (AT); Michael Sommer, Raubling (DE)

(73) Assignee: Infineon Technologies AG, Munich (DE)

( * ) Notice: Subject to any disclaimer, the term of this patent is extended or adjusted under 35 U.S.C. 154(b) by 368 days.

(21) Appl. No.: 11/153,811

(22) Filed: Jun. 15, 2005

(65) Prior Publication Data

US 2006/0006411 A1    Jan. 12, 2006

(30) Foreign Application Priority Data

Jun. 16, 2004    (DE) .................. 10 2004 029 200

(51) Int. Cl.
*H01L 23/02* (2006.01)
*G01R 19/00* (2006.01)

(52) U.S. Cl. .................. 257/678; 257/48; 257/690; 257/693; 257/724; 257/E23.001; 257/E23.01; 257/E23.144; 257/E21.067; 257/E21.521; 257/E21.529; 324/71.1; 324/71.3; 324/71.5; 324/76.11

(58) Field of Classification Search .................. 257/664, 257/665, 678–733, E29.111–E29.165, E23.001–E23.194, 257/48, 724, 924; 324/71.1, 71.3, 71.5, 76.11
See application file for complete search history.

(56) References Cited

U.S. PATENT DOCUMENTS

| 4,214,918 | A |   | 7/1980  | Gat et al. |         |
|-----------|---|---|---------|------------|---------|
| 4,888,665 | A |   | 12/1989 | Smith      |         |
| 6,021,050 | A | * | 2/2000  | Ehman et al. | 361/793 |
| 6,784,551 | B2|   | 8/2004  | Auburger et al. |     |
| 6,975,517 | B1| * | 12/2005 | Kwong et al. | 361/763 |

FOREIGN PATENT DOCUMENTS

DE    101 44 462 C1    11/2002

OTHER PUBLICATIONS

German Patent Office Examination Report dated Feb. 16, 2005.
German Patent Office Examination Report dated Feb. 21, 2006.

* cited by examiner

*Primary Examiner*—Jasmine J Clark
(74) *Attorney, Agent, or Firm*—Patterson & Sheridan, L.L.P.

(57) ABSTRACT

The invention relates a substrate for a package for an electronic circuit and methods for packaging an electronic circuit with a substrate. The substrate comprises at least one conduction region and an activation region arranged within the substrate. The activation region is generally in contact with the conduction region and is configured to change its electrical resistance when activation occurs.

17 Claims, 2 Drawing Sheets

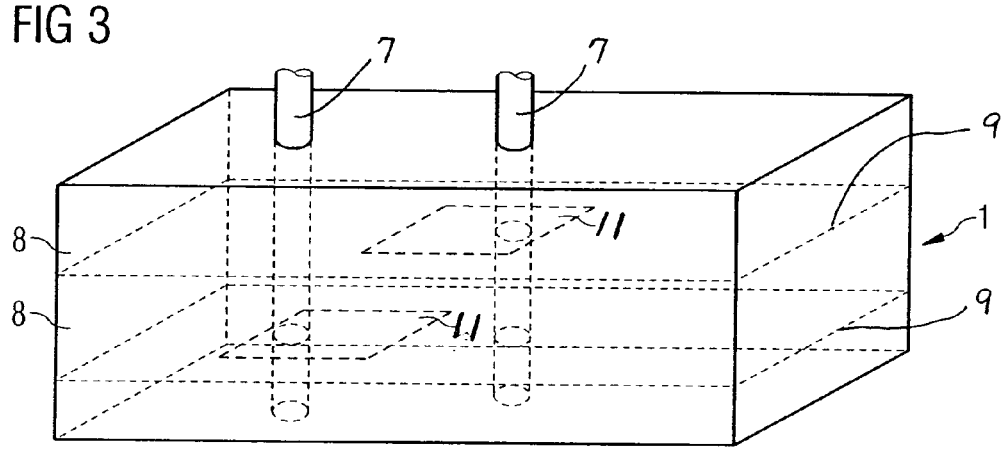

METHOD FOR PRODUCING A PACKAGE FOR AN ELECTRONIC CIRCUIT AND A SUBSTRATE FOR A PACKAGE

CROSS-REFERENCE TO RELATED APPLICATIONS

This application claims foreign priority benefits under 35 U.S.C. §119 to co-pending German patent application number DE 10 2004 029 200.0, filed on 16 Jun. 2004. This related patent application is herein incorporated by reference in its entirety.

BACKGROUND OF THE INVENTION

1. Field of the Invention

The invention relates to a method for producing a package for an electronic circuit with a substrate. The invention also relates to a substrate for a package for an electronic circuit.

2. Description of the Related Art

Integrated circuits are usually fitted in packages. To make terminal areas of the integrated circuits accessible via terminal contacts of the package, packages usually have wiring devices which provide an electrical connection between the terminal contacts and the terminal areas. For this purpose, some types of package have wiring interposer circuit boards, which are formed with one or more layers and on the upper side of which the integrated circuit is arranged and connected to interconnects located on it and on the underside of which the terminal contacts are provided. The connection between the integrated circuit and the terminal contacts takes place by way of conduction regions and/or plated-through connections through the circuit board.

During a signal transmission, signal crosstalk and interferences may occur on the signal lines and supply lines through the circuit board especially when transmitting high-frequency signals. These effects are usually reduced by providing suitable passive components, such as resistors and capacitances, which are provided on a system board and are electrically connected to the terminal contacts. The provision of resistors and capacitances that are separate from the integrated circuit requires additional space on the system board. Moreover, the provision of additional components significantly increases the probability of defects occurring in a system as a whole.

Multilayer printed circuit boards for packages for electronic circuits are used wherever the integrated circuit has to be in connection with so many terminal contacts that crossing lines between the terminal contacts and the terminal areas of the electronic circuit cannot be avoided. The multilayer printed circuit boards are produced by introducing corresponding interconnects between layers of the circuit boards before the layers are bonded to one another. This represents a complex process, making the packages for such electronic circuits very expensive.

SUMMARY OF THE INVENTION

It is an object of the present invention to provide a method for producing a package for an electronic circuit in which the electrical connections between the terminal contacts and the terminal areas of the electronic circuit can be realized in a simple way. It is also an object of the present invention to provide a substrate for a package for an electronic circuit which can be produced in a simple way.

The present invention generally provides a method for producing a package for an electronic circuit with a substrate. The method involves forming a first activation region in the substrate, forming a first conduction region in the substrate and activating the first activation region to reduce interference occurring in a signal line in contact with at least one of the first conduction region and the first activation region.

The present invention further provides a substrate for packaging an electronic circuit. The substrate comprises at least one conduction region and a first activation region, wherein the first activation region is in contact with a first conduction region of the at least one conduction region and an electrical resistance of the first activation region various when activation occurs.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 shows a perspective sectional view through a substrate according to one embodiment of the invention, in which a capacitor is contacted with the aid of the activation regions.

DETAILED DESCRIPTION OF THE PREFERRED EMBODIMENT

Overview

Figure 1:
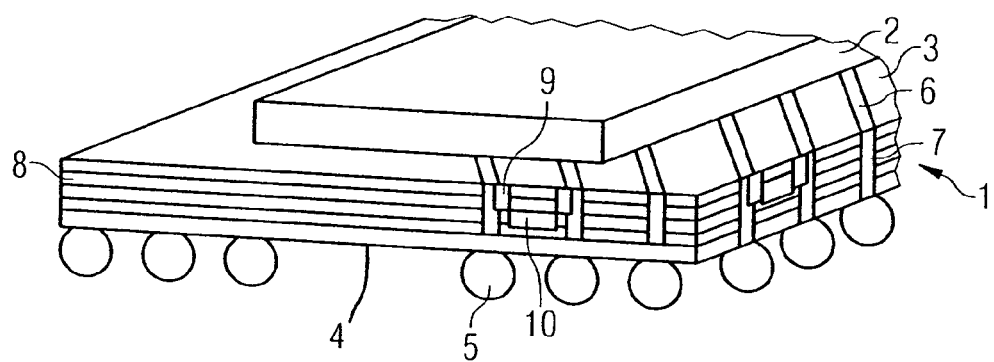
FIG. 1 shows a perspective sectional view of a package according to one embodiment of the present invention.

According to a first aspect of the present invention, a method for producing a package for an electronic circuit with a substrate is provided. This involves initially incorporating an activation region into the substrate. The activation region is configured to change its electrical resistance when activation occurs. Furthermore, a conduction region and/or a passive component is provided in the substrate, so that the activation region is in contact with the conduction region. The activation region is optionally activated to change the resistance of the activation region, so that an electrical connection is formed by the conduction region and the activation region and/or the passive component.

The method offers the possibility of providing a substrate which can be modified after the construction of the package by activation in such a way that electrical connections and/or passive components can be formed. This allows for interferences on signal lines that are established after the completion of the package to be reduced by the provision of passive components, such as resistors or capacitances for example. Furthermore, after the completion of the package, connections between two conduction regions can optionally be created in the substrate by subsequent activation, for example to reduce the resistance of a connecting line, to divert it or to short-circuit it with another terminal area of the electronic circuit.

It may be provided that the activation region reduces its resistance when activation occurs.

According to one embodiment of the invention, the activation region may be in contact with two conduction regions, an electrical resistance between the two conduction regions being reduced when the activation region is activated.

According to a further embodiment, a first and a second activation region are provided, the first activation region being activatable with a first activation energy and the second activation region being activatable with a second activation energy, in order to activate the first and second activation regions independently of each other. In this way it is possible to provide a number of activation regions which can be selectively activated in order to selectively form passive components or electrical connections.

It may be provided that a first and a second activation region are provided substantially lying opposite, the first activation region and the second activation region forming a capacitor when they are activated. In this case, the first activation region and the second activation region may be respectively arranged in such a way that the first activation region is in contact with a first conduction region and the second activation region is in contact with a second conduction region.

According to an alternative embodiment, a first and a second conduction region may be provided substantially lying opposite to form a capacitance, so that the first conduction region is in contact with a first activation region and/or the second conduction region is in contact with a second activation region.

Alternatively, the activation region may be applied in a substantially flat form on a layer or between two layers of the substrate, the activating of the activation region being carried out selectively, so that a first portion of the activation region is activated and a second portion of the activation region is not activated.

According to a further embodiment of the invention, the activating of the activation region is carried out by irradiating the activation region with a light, with an electromagnetic radiation or with a particle radiation and/or by heating up the activation region. The material of the activation region is in this case a material which can be activated with the corresponding activation energy supplied by the irradiation or heating up, so that its electrical resistance changes (e.g., reduced).

Furthermore, it may be provided that a signal transmission of a signal is carried out on a signal line and interferences occurring in the signal transmission are measured. The activating of the activation region that is in contact with the signal line directly or via the conduction region is (or is not) carried out subject to the interferences determined.

According to a further aspect of the present invention, a substrate for a package for an electronic circuit is provided. Provided in the substrate is at least one conduction region, which is arranged within the substrate. Incorporated in the substrate is an activation region which is in contact with the conduction region, the activation region being designed in such a way that it changes its electrical resistance when activation occurs.

This provides a substrate for the production of a package for an electronic circuit in which passive components can be implemented in a simple manner by an activation process in order to reduce signal interferences, for example caused by crosstalk of signals between neighboring signal lines. Furthermore, such a substrate offers the possibility of optionally producing additional connections to the electronic circuit after the construction of the package.

According to one embodiment of the invention, the conduction region may be contactable from the surface.

According to one embodiment, two activation regions may be arranged lying opposite to form a capacitor in which an isolating layer therebetween represents the dielectric when activation occurs.

In particular, each of the two activation regions comes into contact with a conduction region to arrange the capacitor between the two conduction regions when activated.

According to an alternative embodiment, the conduction region may form a passive component, the activation region contacting the passive component when it is activated and the activation region being arranged in such a way that it can be contacted from a surface of the substrate.

DETAILED DESCRIPTION

Shown in a perspective view in FIG. 1 is a fine-pitch ball grid array (FBGA) package, which has a substrate 1, to which a chip 2 with an integrated circuit (not shown) is applied. The substrate 1 has an upper side 3, on which the chip 2 is attached, and an underside 4, on which terminal contacts 5, for example in the form of solder beads 5, are located. The solder beads 5 are typically arranged in a grid in such a way that they are at an adequate spacing from one another for application to a system board (not shown). Usually, the grid in which the solder beads 5 have to be arranged is prescribed by the specification of the FBGA package.

The terminal areas (not shown) of the chip 2 are routed to through-connections 7 by connecting lines 6 arranged on the upper side 3 of the substrate. The through-connections 7 form continuous regions through the substrate 1 to create an electrically conducting connection between the upper side 3 of the substrate 1 and the solder beads 5 arranged on the underside 4.

The substrate 1 is made up of a number of layers 8. A conduction region and/or passive component 10 in the form of a resistor or a capacitor may be arranged in the layers 8. The conduction region and/or passive component 10 is in contact with at least one of the plated-through connections 7 by way of the activation region 9.

The activation region 9 can be activated with an aid of a suitable activation such that its electrical resistance changes. In one aspect, when the activation region 9 is activated, the electrical resistance of the activation region 9 is reduced. Thus, an electrically conducting connection between the conduction region and/or passive component 10 and the plated-through connection 7 may be formed upon activation of the activation region 9 in contact with both the conduction region and/or passive component 10 and the plated-through connection 7.

The activation region 9 may be changed by exposure to a specific activation energy that its electrical resistance permanently changes. The activation energy may be provided by irradiating with light (e.g., visible, infrared, UV), electromagnetic radiation (for example, microwaves) or with a particle radiation or by heating up to a specific temperature. In one embodiment, the material for the activation region 9 is preferably a material which in the basic state does not conduct, or conducts poorly, and the resistance of which is reduced by activation. In another embodiment, the material of the activation region 9 may be in a conducting form, and the activation causes the resistance of the material to rise.

Alternatively, the activation region may merely serve as an electrical connecting region to two conduction regions or from plated-through connections and is arranged between the layers of the substrate.

Figure 2:
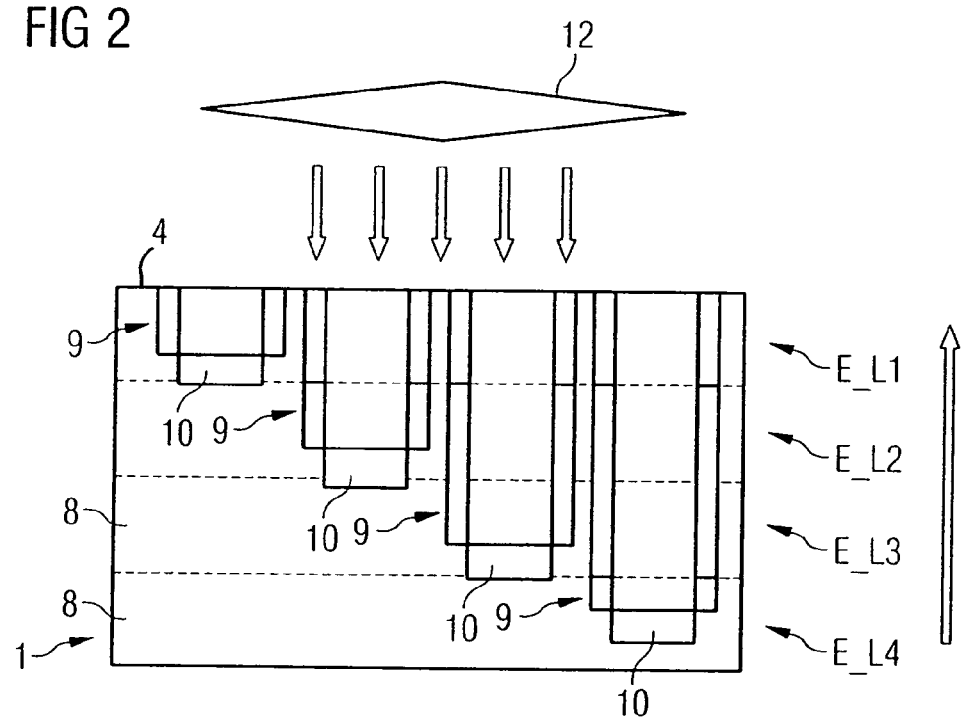
FIG. 2 shows a further sectional view of an enlarged representation of the substrate with a number of layers and activation regions arranged in it.

Represented in FIG. 2 is an enlarged detail from a substrate 1 according to one embodiment of the invention which is subjected to activation with a specific activation energy. In the exemplary embodiment represented in FIG. 2, activation regions 9 are formed as regions which run substantially perpendicular to the substrate surface and may also be in contact with plated-through connections 7, which are not represented in this sectional view for reasons of overall clarity. Arranged between the activation regions 9 are conduction regions and/or passive components 10, which may for example comprise a resistor and/or a capacitor. Alternatively, the activation regions 9 may also act as a resistor or as a capacitor when they have been activated in a corresponding way.

The substrate 1 comprises a number of layers 8, in which the activation regions 9 are arranged. The activation regions 9 in the various layers 8 have different activation energies E. The activation regions 9 arranged the closest to the activation energy source 12 may have the greatest activation energy E-L1, while the activation regions arranged the furthest away from the activation energy source 12 may have the least activation energy E-L4. Consequently, the appropriate activation regions 9 can be activated by choice of the activation energy. Furthermore, the activation energy E can be selectively introduced to the rear surface 4 of the substrate 1 with a specific activation energy.

The activation regions 9 may also be designed in such a way that only a specific activation energy, for example light of a specific wavelength, brings about the activation, while light of a greater or lesser wavelength does not bring about activation.

The substrate 1 generally has a number of layers 8 to arrange the conduction regions and/or the passive components 10 in it in a simple way. In one aspect, the conduction regions and/or the passive components 10 are applied to one of the layers 8, and the next layer is applied on top to arrange the passive component 10 within the substrate in a specific region.

The layers 8 of the substrate 1 may also be formed altogether as an activation layer, so that the activation region is implemented by targeted activation with an aid of masking or a targeted recording operation, for example with a laser beam. The regions impinged by the activation energy E can then be changed into a region with low resistance. By suitable masking of the activation energy source 12 or by suitable programming of the beam recording device, these regions are arranged in such a way that the conductive regions and/or the passive components 10 in the substrate 1 are electrically contacted by the activated activation regions 9 and that the activated activation regions 9 provide electrical connections to a plated-through connection 7.

FIG. 3 shows that a capacitor can be arranged in a substrate 1, for example, without the provision of a conventional electrical component. For this purpose, the surfaces of two successive layers 8 of the substrate 1 are provided as activation regions 9, which may be selectively activated with an aid of a mask or a targeted recording operation to create in these activation regions 9 two surface areas 11 which are arranged one on top of the other and are electrically separated from each other by the layer 8 of the substrate 1 lying in between. The two surface areas 11 formed in this way are connected to various plated-through connections 7, for example, directly or by way of conduction regions. The two surface areas 11 are separated by the layer 8 such that the layer 8 forms a dielectric for a capacitor formed by the surface areas 11. Thus, the precautionary provision of conventional passive components in the substrate 1 can be avoided or reduced, and the passive component may be formed by selective activation of the individual activation layers.

While the foregoing is directed to embodiments of the present invention, other and further embodiments of the invention may be devised without departing from the basic scope thereof, and the scope thereof is determined by the claims that follow.

What is claimed is:

1. A method for producing a package for an electric circuit with a substrate, the method comprising:
    forming a first activation region in the substrate, wherein the first activation region changes its electrical properties when activation occurs;
    forming a first conduction region in the substrate in contact with the first activation region;
    selectively activating the first activation region to change an electrical connection between the first conduction region and the first activation region; and
    measuring interferences occurring in a signal line connected to the activation region, wherein the first activation region is selectively activated in response to the measured interferences.

2. The method of claim 1, wherein the first activation region reduces its resistance when activated.

3. The method of claim 1, wherein the first activation region is activated by irradiating the first activation region with at least one of a light, an electromagnetic radiation, a particle radiation and a thermal source.

4. The method of claim 1, further comprising:
    forming a second conduction region in the substrate in contact with the first activation region, wherein an electrical resistance between the first and second conduction regions is reduced when the activation region is activated.

5. The method of claim 1, further comprising:
    forming a second activation region disposed substantially opposite the first activation regions, wherein a capacitor is formed by the first and second activation regions when activated.

6. The method of claim 5, wherein the substrate includes a plurality of layers and corresponding surfaces, and wherein the first and second activation regions are formed on different surfaces; and further comprising:
    selectively activating one or more portions of each activation region.

7. The method of claim 1, further comprising:
    forming a second conduction region disposed substantially opposite the first conduction region, wherein the first and second conduction regions form a capacitor; and
    forming a second activation region in contact with the second conduction region.

8. The method of claim 1, further comprising:
    forming a plurality of activation regions in the substrate, wherein each of the plurality of activation regions has a respective activation energy which independently activates the respective activation region.

9. A substrate for packaging an electronic circuit, comprising:
    a first activation region having an electrical property that changes irreversibly when the first activation region is activated, wherein the first activation region is activated by at least one of a light, an electromagnetic radiation, a particle radiation and a thermal source; and
    a first conduction region disposed in contact with the first activation region, wherein an electrical connection between the first conduction region and the first activation region is changed irreversibly when the first activation region is activated.

10. The substrate of claim 9, wherein the first conduction region is contactable to the electronic circuit disposed on a surface of the substrate.

11. The substrate of claim 9, wherein the first activation region comprises a material which is highly resistive when not activated and lowly resistive when activated.

12. A substrate for packaging an electronic circuit, comprising:
   a first activation region having an electrical property that changes irreversibly when the first activation region is activated;
   a first conduction region disposed in contact with the first activation region, wherein an electrical connection between the first conduction region and the first activation region is changed irreversibly when the first activation region is activated; and
   a second activation region disposed substantially opposite the first activation region, wherein the first and second activation regions form a capacitor when activated.

13. The substrate of claim 12, further comprising:
   a plurality of layers and corresponding surfaces, wherein the first and second activation regions are formed on different surfaces.

14. The substrate of claim 13, wherein each activation region includes a plurality of selectably activatable portions.

15. A substrate for packaging an electronic circuit, comprising:
   a first activation region having an electrical property that changes irreversibly when the first activation region is activated;
   a first conduction region disposed in contact with the first activation region, wherein an electrical connection between the first conduction region and the first activation region is changed irreversibly when the first activation region is activated; and
   a second conduction region disposed in contact with the first activation region, wherein a resistance region is formed between the first and second conduction region when the first activation region is activated.

16. A substrate for packaging an electronic circuit, comprising:
   a plurality of connectors disposed through the substrate, each connector having a first end for connecting to the electronic circuit and a second end connected to a terminal contact of the substrate;
   a plurality of passive components disposed in the substrate;
   a plurality of activation regions, each activation region disposed in contact between one of the plurality of connectors and one of the plurality of passive components, wherein each activation region is selectively activated to provide an electrical connection to the respectively connected connector and passive component; and
   a plurality of layers, wherein different activation energy is required to activated the activation regions disposed in different layers of the substrate.

17. The substrate of claim 16, wherein each passive component comprises at least one of a resistor and a capacitor.

* * * * *